(12) United States Patent
Carvalho et al.

(10) Patent No.: US 11,196,417 B2
(45) Date of Patent: Dec. 7, 2021

(54) MOTOR VEHICLE CONTROL DEVICE AND METHOD FOR MANUFACTURING AN AT LEAST PARTLY ELECTRICALLY CONDUCTIVE CONTROL UNIT FOR A MOTOR VEHICLE CONTROL DEVICE

(71) Applicant: BCS AUTOMOTIVE INTERFACE SOLUTIONS GMBH, Radolfzell (DE)

(72) Inventors: Nelson Carvalho, Aach (DE); Pawel Borowczyk, Czestochowa (PL); Steffen Sornberger, Hilzingen/Twiefeld (DE); Helmut Sowig, Villingen-Schwenningen (DE); Viktor Beliuzhenko, Constance (DE); Leandro Conde, Singen (DE)

(73) Assignee: BCS AUTOMOTIVE INTERFACE SOLUTIONS GMBH, Radolfzell (DE)

( * ) Notice: Subject to any disclaimer, the term of this patent is extended or adjusted under 35 U.S.C. 154(b) by 175 days.

(21) Appl. No.: 16/638,835

(22) PCT Filed: Aug. 23, 2018

(86) PCT No.: PCT/EP2018/072769
§ 371 (c)(1),
(2) Date: Feb. 13, 2020

(87) PCT Pub. No.: WO2019/038381
PCT Pub. Date: Feb. 28, 2019

(65) Prior Publication Data
US 2021/0167777 A1    Jun. 3, 2021

(30) Foreign Application Priority Data
Aug. 23, 2017  (DE) .................. 10 2017 119 235.2

(51) Int. Cl.
*H05K 5/00*       (2006.01)
*H03K 17/96*      (2006.01)
(Continued)

(52) U.S. Cl.
CPC ....... *H03K 17/962* (2013.01); *B29C 45/1671* (2013.01); *H05K 5/0017* (2013.01);
(Continued)

(58) Field of Classification Search
USPC ........................................... 361/748
See application file for complete search history.

(56) References Cited

U.S. PATENT DOCUMENTS

| 6,676,419 B1 * | 1/2004 | Lin ...................... G06K 19/077 439/131 |
| 9,722,603 B2 | 8/2017 | Koberstein |

(Continued)

FOREIGN PATENT DOCUMENTS

| CN | 201294509 Y | 8/2009 |
| DE | 102006039133 A1 | 3/2008 |

(Continued)

*Primary Examiner* — Sherman Ng
(74) *Attorney, Agent, or Firm* — McNees Wallace & Nurick LLC

(57) ABSTRACT

There is described a motor vehicle control device (10), with an at least partly electrically conductive control unit (12) which on an actuating surface (14) includes at least one capacitive actuating area (26), and a printed circuit board (20) associated to the control unit (12), which is spaced from the actuating surface (14) and comprises at least one electrode (34). The capacitive actuating area (26) comprises at least one sensor surface (24) provided on the actuating surface (14), which via at least one electrically conductive portion (28) of the control unit (12) and a press connection element (32) is electrically and directly connected with the at least one electrode (34) on the printed circuit board (20). The printed circuit board (20) and the control unit (12) are pressed against each other, wherein the press connection element (32) is mechanically connected with the electrode (34) and/or the electrically conductive portion (28). There is furthermore described a method for manufacturing an at (Continued)

least partly electrically conductive control unit (12) for a motor vehicle control device (10).

17 Claims, 4 Drawing Sheets

(51) Int. Cl.
  *B29C 45/16* (2006.01)
  *B29L 31/30* (2006.01)
  *B29L 31/34* (2006.01)
  *B60K 37/06* (2006.01)

(52) U.S. Cl.
  CPC ....... *B29L 2031/30* (2013.01); *B29L 2031/34* (2013.01); *B60K 37/06* (2013.01); *H03K 2217/960755* (2013.01)

(56) References Cited

U.S. PATENT DOCUMENTS

| | | |
|---|---|---|
| 2005/0205407 A1 | 9/2005 | Hein et al. |
| 2008/0310131 A1* | 12/2008 | Fino ................. H05K 7/20454 361/758 |
| 2014/0166462 A1 | 6/2014 | Jonely et al. |
| 2014/0167445 A1 | 6/2014 | Uebelein et al. |
| 2014/0340353 A1 | 11/2014 | Chen et al. |
| 2014/0346022 A1 | 11/2014 | Keller et al. |
| 2015/0123936 A1 | 5/2015 | Keller |
| 2015/0245483 A1* | 8/2015 | Miyasaka ............ H05K 3/4015 303/20 |
| 2015/0253900 A1 | 9/2015 | Sugii et al. |
| 2016/0043486 A1* | 2/2016 | Wuerstlein ......... H01R 12/7076 439/78 |
| 2016/0057882 A1* | 2/2016 | Wuerstlein ........... H05K 7/1427 361/752 |
| 2016/0339893 A1* | 11/2016 | Heise .................... B60T 13/686 |
| 2017/0077627 A1* | 3/2017 | Matsumoto ........... H01R 13/03 |
| 2019/0158088 A1 | 5/2019 | Hieltscher |

FOREIGN PATENT DOCUMENTS

| | | |
|---|---|---|
| DE | 102010033390 A1 | 2/2012 |
| DE | 102013018829 A1 | 5/2015 |
| DE | 102014018470 A1 | 6/2016 |
| EP | 28274972 A2 | 1/2015 |
| EP | 3059862 A1 | 8/2016 |
| EP | 3179633 A1 | 6/2017 |

* cited by examiner

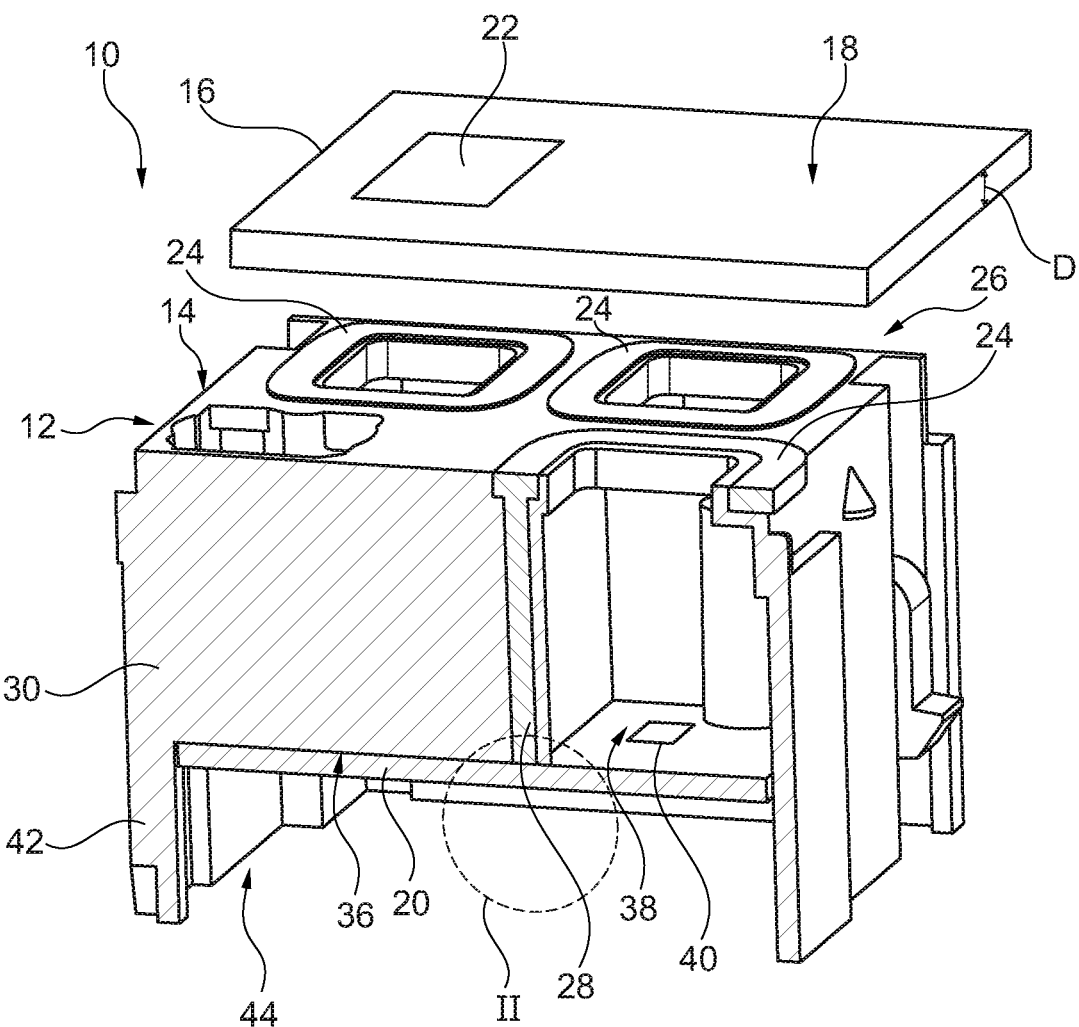
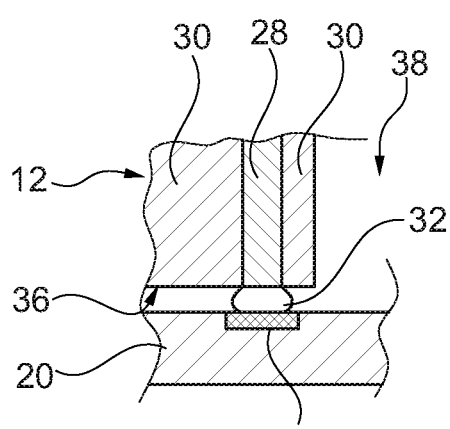
Fig. 2a
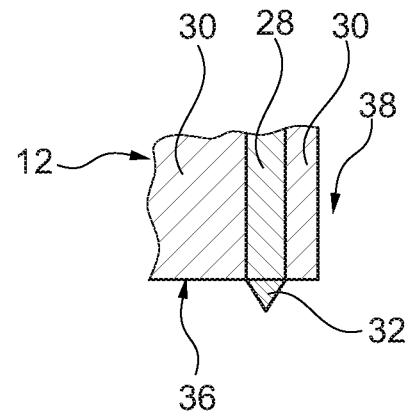
Fig. 2b

MOTOR VEHICLE CONTROL DEVICE AND METHOD FOR MANUFACTURING AN AT LEAST PARTLY ELECTRICALLY CONDUCTIVE CONTROL UNIT FOR A MOTOR VEHICLE CONTROL DEVICE

RELATED APPLICATIONS

This application filed under 35 U.S.C § 371 is a national phase application of International Application Serial Number PCT/EP2018/072769, filed Aug. 23, 2018, which claims the benefit of German Application No. 10 2017 119 235.2 filed Aug. 23, 2017, the subject matter of which are incorporated herein by reference in their entirety.

BACKGROUND

The invention relates to a motor vehicle control device as it is provided in an interior space of a motor vehicle for operating vehicle functions. Furthermore, the invention relates to a method for manufacturing an at least partly electrically conductive control unit for a motor vehicle control device.

From the prior art, there are known motor vehicle control devices by means of which a vehicle occupant can activate or deactivate certain functions of the motor vehicle, which also can be referred to as vehicle functions. The motor vehicle control devices therefor usually include a control surface on which several switching symbols are provided, which represent or visually display the corresponding vehicle functions. The switching symbols to be actuated each can be part of a capacitive sensor via which the corresponding vehicle function is activated or deactivated by the vehicle occupant moving his/her finger into the region of the capacitive sensor and optionally touching the corresponding switching symbol. The capacitive sensor therefor includes a sensor surface which detects the approach to the switching symbol or the touch thereof.

Usually, the sensor or the sensor surface is connected with a printed circuit board by means of a cable and a plug coupled with the cable, i.e. a corresponding female connector on the printed circuit board, in order to transmit the electrical signals to the printed circuit board on which a control and evaluation unit is provided, in order to evaluate the detection of the approach or touch and correspondingly actuate the components of the motor vehicle associated to the vehicle function.

In the motor vehicle control devices known from the prior art it was found to be disadvantageous that the construction and hence also the assembly are complicated, as many separate parts are provided, which must be coupled with each other during the assembly. The complicated assembly becomes even more difficult due to the fact that typically little installation space is available.

SUMMARY

It is the object of the invention to provide a simply constructed, easily mountable and reliably operating motor vehicle control device.

According to the invention, the object is solved by a motor vehicle control device with an at least partly electrically conductive control unit, which on an actuating surface includes at least one capacitive actuating area, and a printed circuit board associated to the control unit, which is spaced from the actuating surface and comprises at least one electrode, wherein the capacitive actuating area comprises at least one sensor surface provided on the actuating surface, which via at least one electrically conductive portion of the control unit and a press connection element is directly and electrically connected with the at least one electrode on the printed circuit board, wherein the printed circuit board and the control unit are pressed against each other, and wherein the press connection element is mechanically connected with the electrode and/or the electrically conductive portion.

It is the idea underlying the invention that a direct connection of the sensor surface and the printed circuit board is provided, so that no separate parts are required, which are not mechanically connected with the printed circuit board and the electrically conductive portion, as this is the case with conductive rubbers or similar, separately formed parts. This results in a correspondingly simplified assembly of the motor vehicle control device, whereby the costs of the motor vehicle control device during the manufacture and assembly can be reduced, as merely two parts are pressed against each other, in order to ensure the electrical connection. The actuating surface and the sensor surface lie in one common plane which is part of the actuating area of the motor vehicle control device, namely on a side of the operating part facing away from the printed circuit board. The sensor surface detects the approach to or touch of the motor vehicle control device by a vehicle occupant, in particular his/her finger, wherein a corresponding signal is transmitted to the electrode provided on the printed circuit board via the electrically conductive portion, which is electrically coupled with the sensor surface, in order to evaluate the corresponding signal. On the printed circuit board a control and evaluation unit therefor is provided, which actuates a vehicle component associated to the switching symbol in dependence on the detected touch or approach. The electrical contact between the printed circuit board and the control unit is ensured via the press connection, in which the electrically conductive portion and the printed circuit board are pressed against each other, in particular with the interposed press connection element which can be compressed when the printed circuit board is pressed against the control unit.

The control unit can have been manufactured by a two-component injection molding method. Accordingly, the control unit includes a base body of an electrically non-conductive material, wherein at least the electrically conductive portion has been incorporated as second component during the manufacturing method, in order to ensure the partial electrical conductivity of the control unit. The control unit thus can be manufactured at low cost and in a simple way.

Generally, the at least partly electrically conductive control unit can thus include a base body of an electrically non-conductive material to which the (electrically conductive) sensor surface and the electrically conductive portion are injection-molded.

The (electrically conductive) sensor surface and the electrically conductive portion can be made of an electrically conductive material. In so far, a first material is provided for the base body, whereas a second material is provided for the (electrically conductive) sensor surface and the electrically conductive portion.

Therefore, the base body and the (electrically conductive) sensor surface and the electrically conductive portion can be cohesively connected with each other.

The base body and the (electrically conductive) sensor surface and the electrically conductive portion are in particular integrally formed with each other.

The base body and the (electrically conductive) sensor surface and the electrically conductive portion are for example manufactured in one manufacturing step, in particular by a two-component injection molding method.

One aspect provides that the at least one electrically conductive portion extends substantially vertically to the sensor surface. In so far, the electrically conductive portion extends through the control unit, in particular the base body of the control unit, in order to be electrically connected with the printed circuit board. The printed circuit board is located on the side of the control unit opposite the actuating surface, so that the electrically conductive portion substantially extends through the entire base body.

According to another aspect, the at least one electrically conductive portion and the sensor surface are formed of the same material, in particular integrally connected with each other. Accordingly, the sensor surface likewise is made of an electrically conductive material. The material of the electrically conductive portion and the sensor surface can be provided as second component during the manufacturing method of the control unit, for example the two-component injection molding method. The sensor surface and/or the electrically conductive portion can be injection-molded to the base body, in particular within the same mold.

The material for example is a conductive silicone or a conductive thermoplastic material, which is used to form the sensor surface and/or the electrically conductive portion.

Another aspect provides that between the sensor surface and the electrode a cable-free or plug-free electrical connection exists. This is ensured by the fact that the control unit and the printed circuit board are directly pressed against each other, whereby a corresponding press connection exists, which at the same time ensures an electrical connection via the electrode and the electrically conductive portion, in particular due to the electrically conductive press connection element which is mechanically connected with the electrode and the electrically conductive portion. In this way a separately formed component is saved, which otherwise is necessary for the connection of the printed circuit board with the control unit and must be connected during the assembly. The assembly effort and the manufacturing costs are reduced correspondingly.

According to one embodiment, the press connection element in the non-pressed condition protrudes beyond an exit surface of the control unit, which faces the printed circuit board, by at least 0.2 mm, in particular by at least 0.8 mm. This ensures that an electrical connection between the control unit and the printed circuit board, in particular the electrode arranged on the printed circuit board, continuously is ensured, even if in operation the motor vehicle is exposed to vibrations or the like. The printed circuit board and the control unit can be pressed against each other such that the press connection element is compressed substantially completely, whereby the printed circuit board substantially flatly rests against the exit surface via its electrode. The electrically conductive portion ends in particular at the exit surface, which thus is to be regarded as an end face of the base body which faces the printed circuit board. Beside the vehicle vibrations occurring during the operation, production-related tolerances as well as environmental influences furthermore can be taken into account and compensated correspondingly by means of the protrusion of the press connection element.

The control unit, in particular the base body, can include an external frame which substantially vertically protrudes from the exit surface and encloses a receiving area for the printed circuit board. Accordingly, the printed circuit board substantially is laterally enclosed by the frame of the base body. A corresponding lateral relative movement thus is inhibited.

In particular, the press connection element is provided in an area which has the greatest possible distance to an outer side wall of the motor vehicle control device. It thereby is ensured that no capacitive coupling occurs when a vehicle occupant touches the outer side wall of the motor vehicle control device or a further (electrically conductive) component of the motor vehicle connected therewith. The risk of sensing errors thereby is reduced correspondingly.

One embodiment provides that the press connection element is a press-in connector, in particular wherein the press-in connector is (mechanically) attached to the electrode. In the mounted condition, the press-in connector accordingly is pressed into the electrically conductive portion of the control unit, in case the printed circuit board has been pressed against the control unit during the assembly. A permanent electrical connection thereby is ensured. However, the electrically conductive portion requires no socket into which the press-in connector is plugged, as otherwise is the case with a connector. In so far, the number of the required components and the resulting assembly effort are reduced. The press-in connector likewise protrudes beyond the electrode by at least 0.2 mm, in particular by more than 0.8 mm, in order to ensure a permanently functioning electrical connection.

According to another embodiment, the press connection element is cohesively connected with the at least one electrically conductive portion, in particular injection-molded to the at least one electrically conductive portion. Accordingly, the press connection element likewise can be injection-molded to the control unit, in particular to the electrically conductive portion, by an injection molding method, in order to form a cohesive electrical connection. It can be provided here that the press connection element forms a bead-shaped or mushroom-headed protrusion (in the pressed condition), which cooperates with the electrode of the printed circuit board. In general, the cohesive connection ensures that during the assembly less components must be connected with each other, as the press connection element already is coupled with the control unit. During the assembly of the motor vehicle control device merely the separately formed printed circuit board and the control unit hence must be pressed against each other.

Another aspect provides that the press connection element is formed of an elastic material. It thereby is ensured that the press connection element is (reversibly) deformed when the printed circuit board is pressed against the control unit, in order to ensure a permanent electrical connection, even if corresponding vibrations occur or the distance varies due to environmental influences. Production-related tolerances also can be compensated in this way.

The cross-section of the press connection element can taper, in particular conically, towards its free end. The press connection element initially can easily be compressed thereby, as less material must be displaced. The required compression force then increases with the compression distance due to the increasing cross-section. Via the cross-section and the material of the press connection element as well as the applied pressing force a compression of the press connection element and thus of the distance of the printed circuit board to the control unit can be adjusted.

According to another aspect, the press connection element is formed of the same material as the electrically conductive portion, in particular wherein the press connection element and the electrically conductive portion are integrally connected with each other. Accordingly, the press connection element along with the electrically conductive portion can be formed by the two-component injection molding method when manufacturing the control unit. An additional manufacturing step thereby is saved, as the control unit along with the press connection element can be manufactured by a two-component injection molding method. The control unit with the (injection-molded) press connection element then need only be coupled with the printed circuit board by pressing the control unit and the printed circuit board against each other. The press connection element accordingly can also be formed integrally with the sensor surface, in case the electrically conductive portion and the sensor surface are integrally connected with each other.

In so far, the sensor surface, the electrically conductive portion and the press connection element can be formed integrally with each other, in particular by the second component in the two-component injection molding method used when manufacturing the control unit. On the other hand, at least the base body of the control unit is formed by the first (material) component.

Furthermore, the motor vehicle control device can include a control panel with a control surface, which is associated to the actuating surface of the control unit, wherein in a portion associated to the sensor surface the control panel has a thickness of up to 8 mm. The control panel for example is made of a plastic material, in particular of an acrylonitrile-butadiene-styrene copolymer (ABS). The control surface of the control panel forms the outwardly directed end of the motor vehicle control device, which faces the vehicle occupant for operation. On the control surface switching symbols are shown, which are associated to the corresponding vehicle functions of the motor vehicle, which can be operated by the vehicle occupant. The vehicle occupant accordingly touches the control surface and/or approaches the control surface, in particular a corresponding switching symbol, whereby the sensor surface detects the approach or touch. The thickness of up to 8 mm in this area ensures that the sensor surface can safely detect an approach to or touch of the control surface.

One aspect provides that the control surface has a height profile, wherein in a portion of the height profile associated to the sensor surface the thickness of the control panel varies between 0.1 mm and 8 mm. The control surface thereby can be adapted correspondingly for ergonomic reasons, wherein this depends on the mounting situation of the motor vehicle control device in the vehicle interior. In the remaining portions, in which no sensor surface is associated to the control surface, the thickness of the control panel can lie above 8 mm.

Furthermore, the actuating surface has a profile which substantially is adapted to a height profile of the control surface, so that a distance between the actuating surface and the control surface between 0.1 mm and 8 mm is ensured. This ensures that the actuation or approach to the control surface can be detected correspondingly by the sensor surfaces arranged on the actuating surface.

The invention also provides a method for manufacturing an at least partly electrically conductive control unit for a motor vehicle control device, in which initially a base body of the control unit made of a first material is provided, to which at least the sensor surface and the at least one electrically conductive portion made of a second, electrically conductive material is injection-molded, wherein the second, electrically conductive material is injection-molded to the base body via at least one injection point which substantially is provided in the region of the electrically conductive portion. The material of the electrically conductive portion thus can uniformly run along the base body, in order to form a structure free from cavities, in particular when several sensor surfaces and electrically conductive portions associated to the sensor surfaces are provided. In the region of the electrically conductive portion means that the at least one injection point is not provided on an actuating surface of the control unit, on which the at least one sensor surface is formed, but on a side face substantially vertical to the actuating surface, which like the electrically conductive portion extends from the actuating surface or the sensor surface in direction of an exit surface. Accordingly, the injection point can be provided laterally, for example on the side face of the control unit. The at least one electrically conductive portion ends at the exit surface of the control unit, so that also at this end point of the electrically conductive portion the at least one injection point can be provided.

One aspect provides that the control unit is manufactured by a two-component injection molding method. The electrically conductive control unit and thus also the motor vehicle control device thereby can be manufactured at low cost. Accordingly, the base body of the control unit initially is manufactured by an injection molding method, wherein the material of the base body represents the first component of the two-component injection molding method. The at least one electrically conductive portion (as well as the sensor surface and/or a press connection element serving for contacting) then are injection-molded to the base body as second component.

According to another aspect, several sensor surfaces and electrically conductive portions each associated to the sensor surfaces are injection-molded at the same time, in particular wherein the sensor surfaces subsequently are separated from each other by interrupting connecting webs of the structure obtained during the formation of the plurality of sensor surfaces. In so far, a complex control unit can be manufactured in a simple way.

The control unit manufactured in this way subsequently can electrically be coupled with the printed circuit board by pressing them against each other. The printed circuit board can be arranged on a pressure part, via which the printed circuit board is pressed against the exit surface. In particular, an electrode of the printed circuit board is pressed against the associated press connection element, which thereby is compressed.

DESCRIPTION OF THE DRAWINGS

Further advantages and properties of the invention can be taken from the following description and the drawings to which reference is made. In the drawings:

FIG. 1 shows a schematic sectional representation of a motor vehicle control device of the invention according to a first embodiment, FIG. 2 shows a detail of FIG. 1.

DETAILED DESCRIPTION

Figure 3:
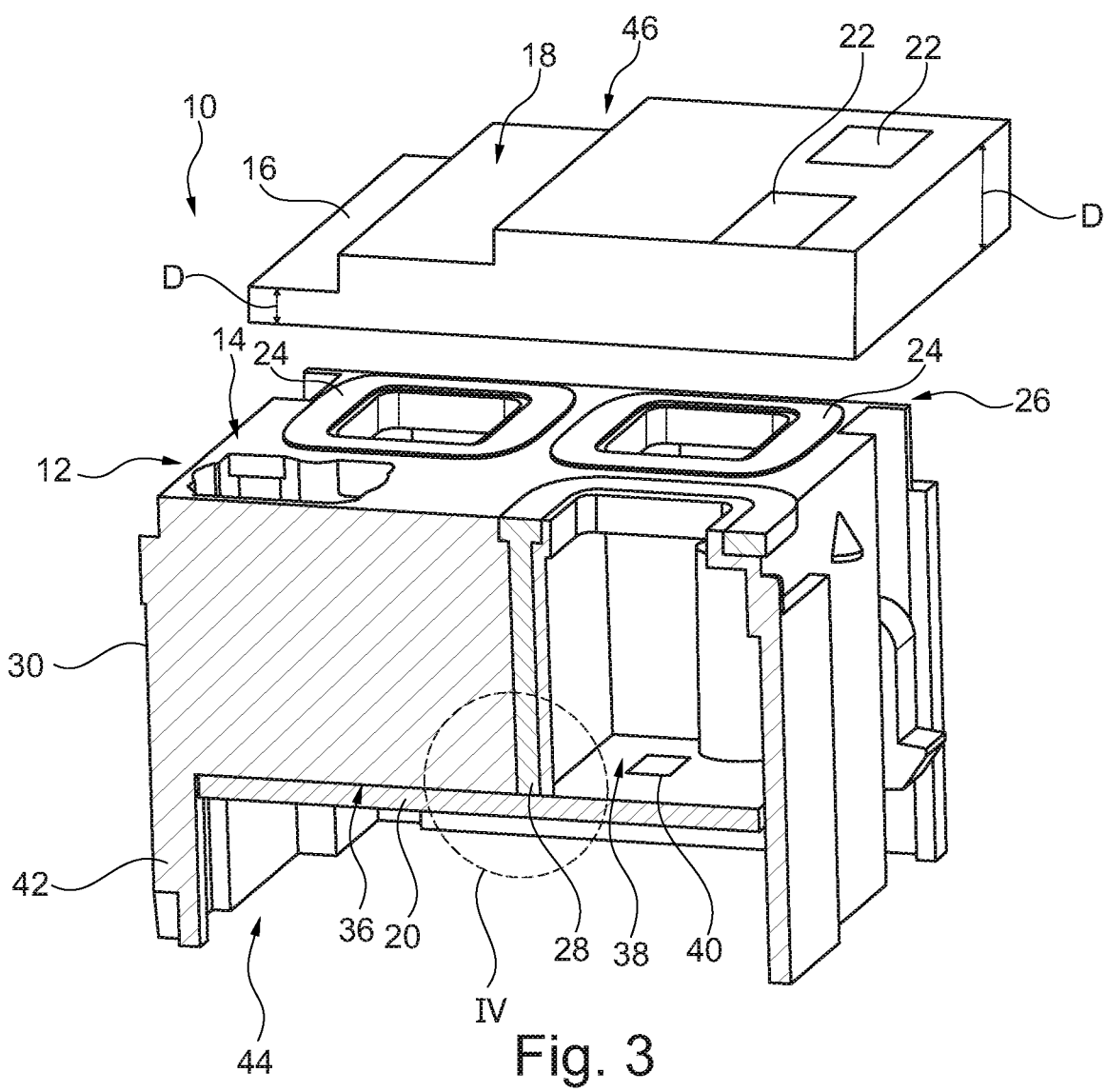
FIG. 3 shows a schematic sectional representation of a motor vehicle control device of the invention according to a second embodiment.

FIG. 1 shows a motor vehicle control device 10 according to a first embodiment, which comprises an at least partly electrically conductive control unit 12 which has an actuating surface 14.

The motor vehicle control device 10 also comprises a control panel 16 which is associated to the actuating surface 14 of the control unit 12. The control panel 16 has a control surface 18 which forms the outer surface of the motor vehicle control device 10, which in the mounted condition faces the vehicle occupant.

Furthermore, the motor vehicle control device 10 comprises a printed circuit board 20 formed separate from the control unit 12, which is associated to the control unit 12, wherein the printed circuit board 20 is arranged on a side of the control unit 12 opposite to the actuating surface 14, as will yet be explained below, On the control surface 18 of the control panel 16 switching symbols are provided on the button 22, which are associated to corresponding vehicle functions of the motor vehicle, which can be activated or deactivated when approaching or touching the corresponding button 22. The vehicle functions can be functions for adjusting the vehicle lighting, i.e. low beam, high beam, fog lamp etc., or multimedia functions of the motor vehicle.

For detection of the approach or touch a sensor surface 24 of the control unit 12 is associated to the respective button 22 or the switching symbol of the button 22, which can lie in one plane with the actuating surface 14.

It can also be provided that the sensor surface 24 protrudes beyond the actuating surface 14.

Accordingly, the sensor surfaces 24 together with the control panel 16, in particular the control surface 18 or a control object of the vehicle occupant such as his/her finger, form a capacitive actuating area 26 via which an approach to or touch of the control surface 18 is detected.

Via an electrically conductive portion 28 of the control unit 12 the corresponding signal, which is generated at the sensor surface 24, is passed away from the sensor surface 24 in direction of the printed circuit board 20, in order to be evaluated and converted there, in particular by a control and evaluation unit arranged on the printed circuit board 20. The electrically conductive portion 28 extends substantially vertically to the sensor surface 24 through a base body 30 of the control unit 12, which in contrast to the sensor surfaces 24 and the electrically conductive portion 28 is formed of an electrically non-conductive material.

The control unit 12 can have been manufactured by a two-component injection molding method, wherein the sensor surfaces 24 and the associated electrically conductive portions 28 are formed of the same material, in particular of an electrically conductive silicone or an electrically conductive thermoplastic material. The sensor surfaces 24 as well as the electrically conductive portions 28 accordingly can be integrally connected with each other, wherein they have been manufactured in a common manufacturing step, for example as second component in the two-component injection molding method.

The base body 30 accordingly is formed by a first (material) component, so that the sensor surfaces 24 and the electrically conductive portions 28 have been injection-molded to the base body 30, in particular in the same cavity of a mold used in the manufacture.

As can be taken from FIGS. 2a, 2b, which show a detail of FIG. 1 in the region of the transition from the electrically conductive portion 28 to the printed circuit board 20, the electrically conductive portion 28 in the illustrated embodiment is electrically connected with the printed circuit board 20, in particular with an electrode 34 provided on the printed circuit board 20, via an elastic press connection element 32.

In the illustrated embodiment, the press connection element 32 is an electrically conductive material which can consist of the same material as the electrically conductive portion 28.

The press connection element 32 for example (subsequently) has been injection-molded to the electrically conductive portion 28, so that the press connection element 32 protrudes beyond an exit surface 36 provided on the control unit 12, which faces the printed circuit board 20. It can be provided that in the non-pressed condition the press connection element 32 protrudes beyond the exit surface 36 by at least 0.2 mm, in particular at least 0.8 mm.

As the press connection element 32 is formed of an elastic material, it can be compressed, as can be taken from FIG. 2a which shows the press connection element 32 in the compressed condition. This is important, as the printed circuit board 20 is pressed against the control unit 12, in order to ensure the electrical connection. The control unit 12 and the printed circuit board 20 together form a press connection, in order to ensure the electrical connection. In so far, the printed circuit board 20, in particular the electrode 34, is directly coupled with the electrically conductive portion 28 of the control unit 12 via the press connection element 32 mechanically connected with the electrically conductive portion 28. Hence, a cable-free or plug-free electrical connection exists between the sensor surface 24 and the electrode 34 of the printed circuit board 20, in order to transmit the detected signals from the capacitive actuating area 26 to the printed circuit board 20.

Furthermore, it can be provided that the press connection element 32, which in the non-pressed condition has its free end associated to the printed circuit board 20, tapers towards its free end, in particular tapers conically (see FIG. 2b). it thereby is ensured that the press connection element 32 can be compressed more easily when the printed circuit board 20 is pressed against the control unit 12, as initially less material must be compressed. In the compressed condition the bead- or mushroom-shaped design of the press connection element 32 then is obtained, as is shown in FIG. 2a.

Instead of the (subsequently) injection-molded connection of the press connection element 32 to the electrically conductive portion 28 it can also be provided that the press connection element 32 is formed integrally with the electrically conductive portion 28 (and the sensor surface 24), in that during the manufacture of the control unit 12 both the electrically conductive portion 28 (and the sensor surface 24) as well as the press connection element 32 is provided as second component in the two-component injection molding method, which second component is electrically conductive.

Thus, in the first embodiment there is generally obtained a mechanical and cohesive connection of the press connection element 32 with the electrically conductive portion 28, as the press connection element 32 either is injection-molded to the electrically conductive portion 28 or integrally connected with the same.

In general, it can be provided that the press connection element 32 and thus the associated electrode 34 has the greatest possible distance to an outer side wall of the motor vehicle control device 10, whereby it is ensured that a touch of the motor vehicle control device 10 on its outer wall or a component associated to the outer side wall does not lead to a sensing error.

In a portion associated to the sensor surface 24 the control panel 16 can have a thickness D which is up to 8 mm. It thereby is ensured that an approach to or touch of the control surface 18 can safely be detected by the underlying sensor surface 24.

The sensor surfaces 24 are circumferentially formed at the actuating surface 14, wherein they each enclose a light duct 38 which is associated to the switching symbol 22 provided on the control surface 18, so that the same can be backlit correspondingly. For this purpose, corresponding light sources 40 are provided on the printed circuit board 20, which are associated to the light ducts 38 or the switching symbols 22.

The electrically conductive portions 28 accordingly extend substantially parallel to the light ducts 38, wherein the electrically conductive portions 28 merely are formed as a web which extends through the base body 30.

FIG. 1 furthermore reveals that the base body 30 comprises an outer frame 42 which substantially vertically protrudes from the exit surface 36. The frame 42 encloses a receiving area 44 in which the printed circuit board 20 is received, which in the mounted condition substantially flatly rests against the exit surface 36.

FIG. 3 shows a second embodiment of the motor vehicle control device 10 according to the invention, which initially differs from the first embodiment according to FIG. 1 by the formation of the control panel 16.

As can be taken from FIG. 3, the control panel 16 includes a control surface 18 which has a height profile 46, so that the thickness D of the control panel 16 varies correspondingly in a portion associated to the sensor surfaces 24.

The thickness D can vary between 0.1 mm and 8 mm, in order to ensure that a touch of the control surface 18 or an approach to the control surface 18 can safely be detected by the underlying sensor surfaces 24.

The actuating surface 14 of the control unit 12 likewise can have a profile which substantially is adapted to the height profile 46, in order to ensure that the distance between the actuating surface 14, in particular the sensor surfaces 24 arranged thereon, and the control surface 18 does not become greater than 8 mm.

Figure 4:
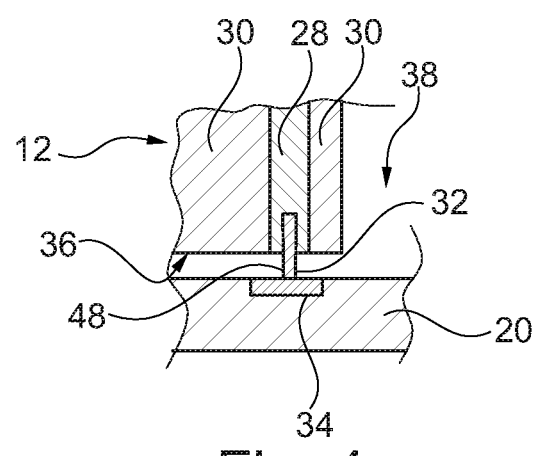
FIG. 4 shows a detail of the motor vehicle control device according to FIG. 1.

As can be taken from FIG. 4, which shows a detail of FIG. 3, the second embodiment furthermore and independent of the control panel 16 differs from the first embodiment in that the press connection element 32 is formed by a press-in connector 48 which is directly and mechanically attached to the printed circuit board 20, in particular to the electrode 34.

When pressing the printed circuit board 20 against the control unit 12, in particular against the exit surface 36 of the control unit 12, the press-in connector 48 presses into the elastic electrically conductive portion 28, in order to ensure the electrical connection between the sensor surface 24 and the electrode 34.

The press-in connector 48 can protrude beyond the surface of the printed circuit board 20 associated to the control unit 12, in particular by at least 0.2 mm, for example by at least 0.8 mm.

In so far, a cable-free electrical connection also is created in this embodiment, which ensures a correspondingly fast and inexpensive manufacture and assembly of the motor vehicle control device 10.

Figure 5:
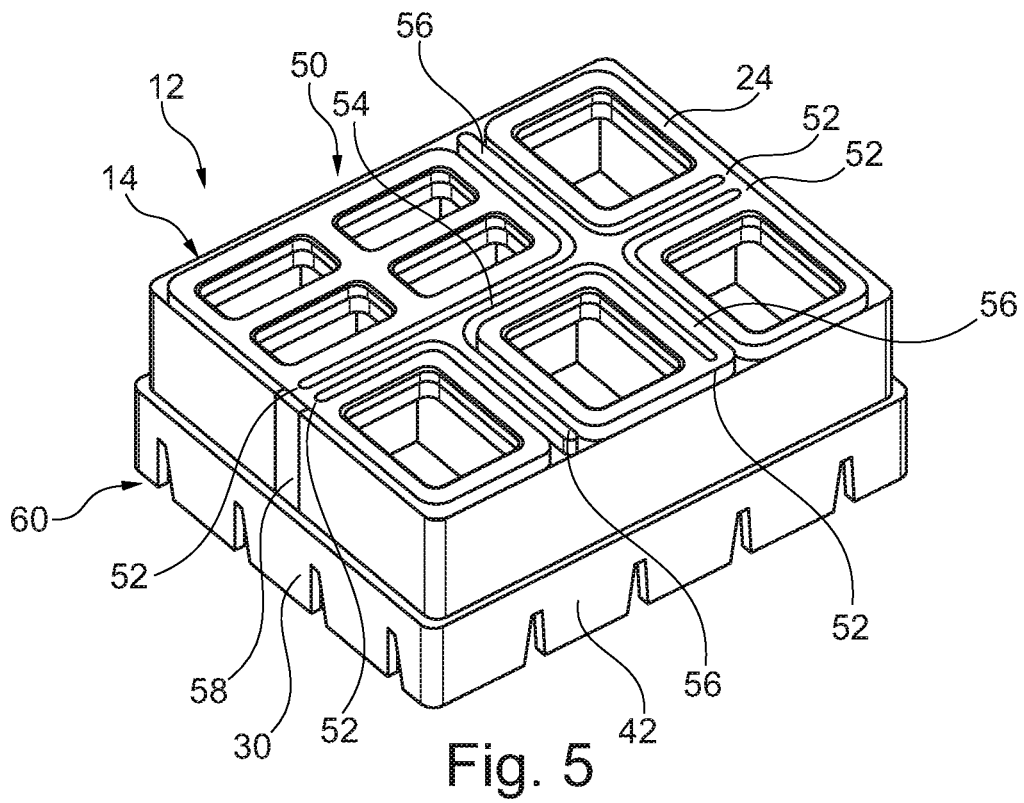
FIG. 5 shows a perspective representation of a control unit manufactured by a manufacturing method according to the invention during the manufacture.
Figure 6:
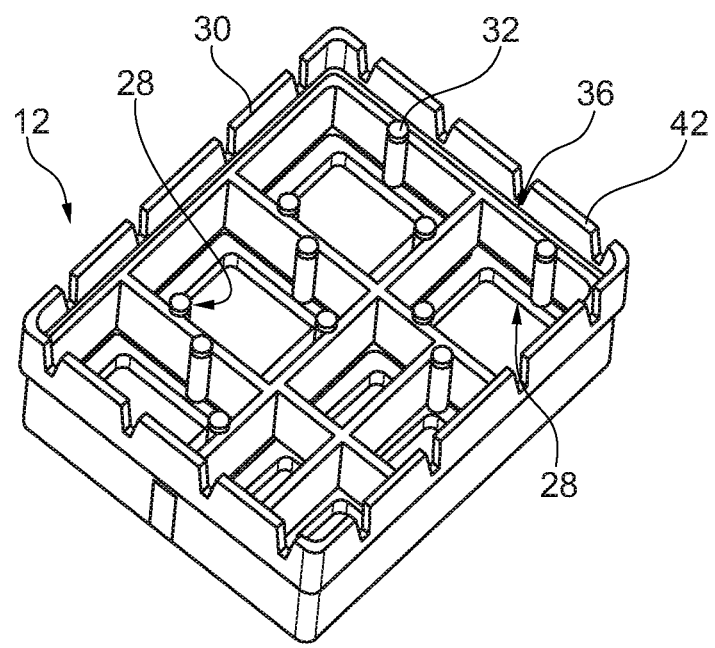
FIG. 6 shows the control unit of FIG. 5 in a further perspective representation.

FIGS. 5 and 6 show a control unit 12 manufactured by a manufacturing method according to the invention from different perspectives.

The control unit 12 comprises the base body 30 which by means of a first component (not electrically conductive) has been manufactured by a two-component injection molding method. In the illustrated condition, the control unit 12 also has a continuous structure 50 which has been manufactured by a second component that is formed of an electrically conductive material.

The structure 50 among other things comprises the sensor surfaces 24, the electrically conductive portions 28 and the press connection elements 32 integrally connected therewith, as can be taken in particular from FIG. 6. In addition, the structure 50 comprises several connecting webs 52 which among other things still connect the sensor surfaces 24 to be separated from each other. These connecting webs 52 are necessary to ensure that the several sensor surfaces 24, the electrically conductive portions 28 and the press connection elements 32 integrally connected therewith can be manufactured in one injection molding step.

In addition, the structure 50 comprises at least one continuously formed shielding web structure 54, which in particular extends between adjacent sensor surfaces 24. The shielding web structure 54 can comprise several fingers 56, which correspondingly extend along the actuating surface 14.

After the sensor surfaces 24 have been isolated from each other by interrupting the connecting webs 52, the shielding web structure 54 serves to electrically isolate the adjacent sensor surfaces 24 from each other, in order to ensure exact sensing.

Furthermore, the structure 50 comprises an injection point 58 which is provided in the region of the electrically conductive portions 28. In the illustrated embodiment, the injection point 58 is provided on a side face 60 of the control unit 12, which is substantially vertical to the actuating surface 14 and the sensor surfaces 24.

The material of the sensor surfaces 24 and the electrically conductive portions 28 thus can uniformly run along the base body 30, in order to form a structure 50 free from cavities.

Figure 8:
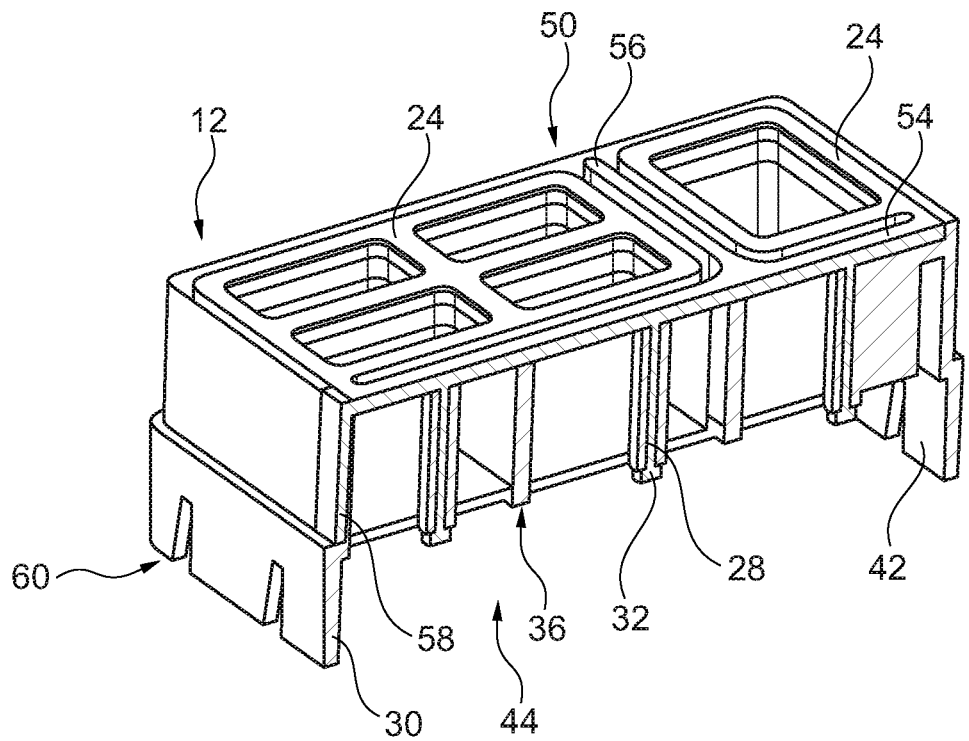
FIG. 8 shows the control unit of FIGS. 5 and 6 in a further sectional representation.

FIG. 8 shows the control unit 12 in a sectional view, which reveals that the shielding web structure 54 likewise comprises electrically conductive portions 28 that extend through the base body 30 in direction of the exit surface 36. The shielding web structure 54 can thereby be grounded or be brought to a defined potential.

Figure 7:
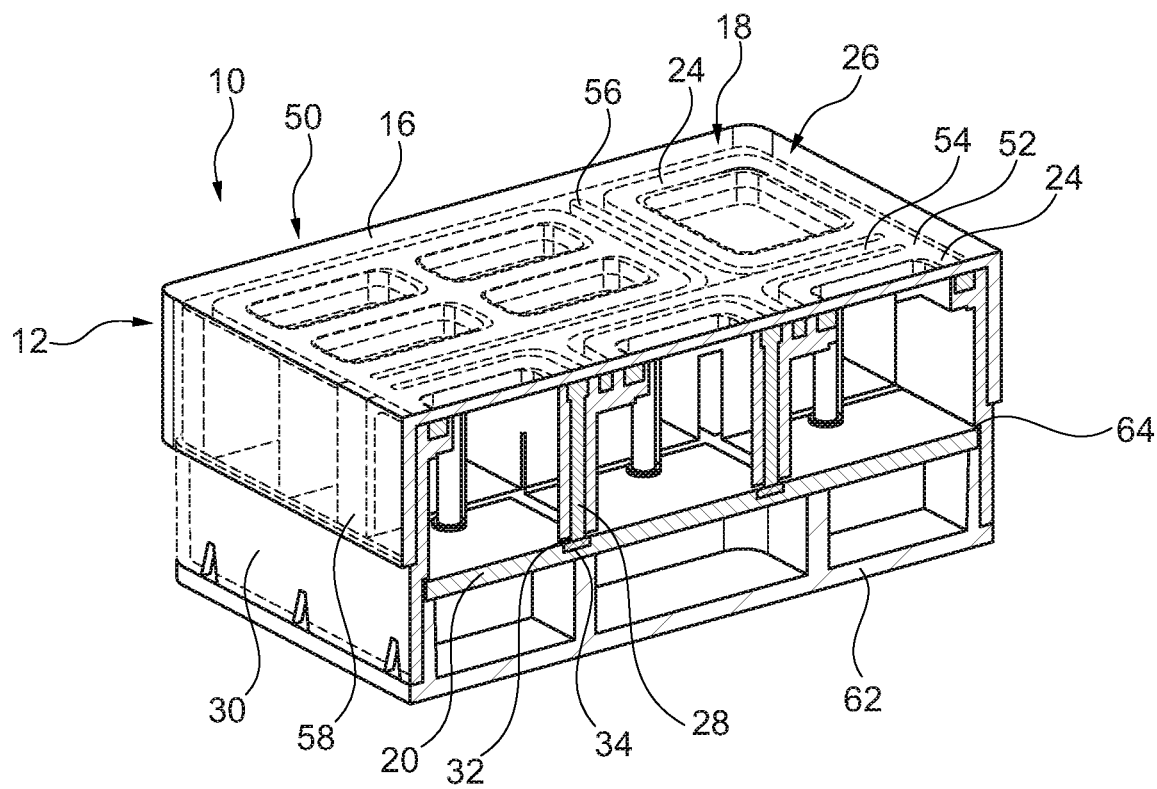
FIG. 7 shows a schematic sectional representation of a motor vehicle control device of the invention according to a third embodiment with the control unit of FIGS. 5 and 6.

FIG. 7 shows the motor vehicle control device 10, which comprises the control unit 12 according to FIGS. 5, 6 and 8, a printed circuit board 20 and a transparent control panel 16.

FIG. 7 reveals that the electrically conductive portions 28 associated to the sensor surfaces 24 are electrically connected with the electrode 34, in that the printed circuit board 20 is pressed against the exit surface 36 via a pressure part 62, so that the press connection elements 32 are compressed correspondingly.

A comparison of FIGS. 7 and 8 clearly shows that the press connection elements 32 have been compressed correspondingly by the printed circuit board 20, when the same is pressed against the control unit 12 via the pressure part 62.

In the pressed condition, the printed circuit board 20 rests against a circumferential collar 64, whereby it is prevented that the press connection elements 32 or the control unit 12 are/is damaged. The collar 64 in particular is part of the exit surface 36. The frame 42 correspondingly protrudes from the circumferential collar 64.

FIG. 7 in particular reveals that the electrical connection of the actuating area 26 and the printed circuit board 20 is produced by two components, namely the printed circuit board 20 and the control unit 12 at least partly comprising the actuating area 26. In so far, an easy assembly of the motor vehicle control device 10 is ensured.

Alternatively or in addition to the shielding web structure 54 provided on the control unit 12 a shield generally can be provided on the printed circuit board 20. Via this shield, the electrodes 34 associated to the sensor surfaces 24 and/or the sensor surfaces 24 themselves can each be shielded from each other.

In so far, a shield (also a multipart shield) generally can be provided in the motor vehicle control device 10, which ensures that no sensing errors occur.

The invention claimed is:

1. A motor vehicle control device (10) comprising an at least partly electrically conductive control unit (12), which on an actuating surface (14) includes at least one capacitive actuating area (26), and a printed circuit board (20) associated to the control unit (12), which is spaced from the actuating surface (14) and comprises at least one electrode (34), wherein the capacitive actuating area (26) comprises at least one sensor surface (24) provided on the actuating surface (14), which via at least one electrically conductive portion (28) of the control unit (12) and a press connection element (32) is electrically and directly connected with the at least one electrode (34) on the printed circuit board (20), wherein the printed circuit board (20) and the control unit (12) are pressed against each other, and wherein the press connection element (32) is mechanically connected with the electrode (34) and/or the electrically conductive portion (28).

2. The motor vehicle control device (10) according to claim 1, wherein the at least one electrically conductive portion (28) extends substantially vertically to the sensor surface (24).

3. The motor vehicle control device (10) according to claim 1, wherein the at least one electrically conductive portion (28) and the sensor surface (24) are formed of the same material, in particular are integrally connected with each other.

4. The motor vehicle control device (10) according to claim 1, wherein between the sensor surface (24) and the electrode (34) a cable-free and/or plug-free electrical connection exists.

5. The motor vehicle control device (10) according to claim 1, wherein the press connection element (32) in the non-pressed condition protrudes beyond an exit surface (36) of the control unit (12), which faces the printed circuit board (20), by at least 0.2 mm, in particular by at least 0.8 mm.

6. The motor vehicle control device (10) according to claim 1, wherein the press connection element (32) is provided in a region which has the greatest possible distance to an outer side wall of the motor vehicle control device (10).

7. The motor vehicle control device (10) according to claim 1, wherein the press connection element (32) is a press-in connector (48), in particular wherein the press-in connector (48) is attached to the electrode (34).

8. The motor vehicle control device (10) according to claim 1, wherein the press connection element (32) is cohesively connected with the at least one electrically conductive portion (28), in particular injection-molded to the at least one electrically conductive portion (28).

9. The motor vehicle control device (10) according to claim 1, wherein the press connection element (32) is formed of an elastic material.

10. The motor vehicle control device (10) according to claim 1, wherein the cross-section of the press connection element (32) tapers, in particular conically tapers towards its free end.

11. The motor vehicle control device (10) according to claim 1, wherein the press connection element (32) is formed of the same material as the electrically conductive portion (28), in particular wherein the press connection element (32) and the electrically conductive portion (28) are integrally connected with each other.

12. The motor vehicle control device (10) according to claim 1, wherein a control panel (16) with a control surface (18) is provided, which is associated to the actuating surface (14) of the control unit (12), wherein in a portion associated to the sensor surface (24) the control panel (16) has a thickness (D) of up to 8 mm.

13. The motor vehicle control device (10) according to claim 12, wherein the control surface (18) has a height profile (46), wherein in a portion of the height profile (46) associated to the sensor surface (24) the thickness (D) of the control panel (16) varies between 0.1 mm and 8 mm.

14. The motor vehicle control device (10) according to claim 12, wherein the actuating surface (14) has a profile which substantially is adapted to a height profile (46) of the control surface (18), so that a distance between the actuating surface (14) and the control surface (18) between 0.1 mm and 8 mm is ensured.

15. A method for manufacturing an at least partly electrically conductive control unit (12) for a motor vehicle control device (10) according to any of the preceding claims, in which initially the base body (30) of the control unit (12) made of a first material is provided, to which at least the sensor surface (24) and the at least one electrically conductive portion (28) made of a second, electrically conductive material is injection-molded, wherein the second, electrically conductive material is injection-molded to the base body (30) via at least one injection point (58) which substantially is provided in the region of the electrically conductive portion (28).

16. The method according to claim 15, wherein the control unit (12) is manufactured by a two-component injection molding method.

17. The method according to claim 15, wherein several sensor surfaces (24) and electrically conductive portions (28) each associated to the sensor surfaces (24) are injection-molded at the same time, in particular wherein the sensor surfaces (24) subsequently are separated from each other by interrupting connecting webs (52) obtained during the formation of the plurality of sensor surfaces (24).

\* \* \* \* \*